(12) United States Patent
Wong et al.

(10) Patent No.: US 8,506,751 B2
(45) Date of Patent: Aug. 13, 2013

(54) IMPLEMENTING SELF-ASSEMBLY NANOMETER-SIZED STRUCTURES WITHIN METAL—POLYMER INTERFACE

(75) Inventors: Kit Ying Wong, Hong Kong (CN); Matthew Ming Fai Yuen, Hong Kong (CN); Bing Xu, Newton, MA (US)

(73) Assignee: The Hong Kong University of Science and Technology, Kowloon (HK)

(*) Notice: Subject to any disclaimer, the term of this patent is extended or adjusted under 35 U.S.C. 154(b) by 521 days.

(21) Appl. No.: 12/662,487

(22) Filed: Apr. 20, 2010

(65) Prior Publication Data

US 2010/0297450 A1 Nov. 25, 2010

Related U.S. Application Data

(60) Provisional application No. 61/214,097, filed on Apr. 21, 2009.

(51) Int. Cl.
| | |
|---|---|
| B32B 7/04 | (2006.01) |
| B32B 37/12 | (2006.01) |
| B32B 15/04 | (2006.01) |
| B32B 15/08 | (2006.01) |
| B05D 3/10 | (2006.01) |

(52) U.S. Cl.
USPC ........... 156/325; 156/326; 428/413; 428/420; 427/301

(58) Field of Classification Search
USPC .......... 156/325, 326; 428/413, 420; 427/301
See application file for complete search history.

(56) References Cited

U.S. PATENT DOCUMENTS

| | | | |
|---|---|---|---|
| 2,371,207 | A | 3/1945 | Zublin et al. |
| 4,812,363 | A | 3/1989 | Bell et al. |
| 5,108,573 | A | 4/1992 | Rubinstein et al. |
| 5,455,072 | A | 10/1995 | Bension et al. |
| 5,487,792 | A | 1/1996 | King et al. |
| 6,616,976 | B2 | 9/2003 | Montano et al. |
| 6,818,117 | B2 | 11/2004 | Ferguson et al. |
| 2003/0047548 | A1 | 3/2003 | Horey et al. |
| 2003/0198765 | A1* | 10/2003 | Levendusky et al. ........ 428/35.7 |
| 2003/0207114 | A1* | 11/2003 | Atzesdorfer et al. ......... 428/403 |
| 2004/0080021 | A1* | 4/2004 | Casper et al. ................. 257/528 |

OTHER PUBLICATIONS

Wong, Cell K Y; Yuen, Mathew M F; "Thiol based chemical treatment as adhesion promoter for Cu-epoxy interface"; 2008 International Conference on Electronic Packaging Technology & High Density Packaging, Jul. 28-31, 2008.

Müller, Rainer et al., "New Adhesion Promoters for Copper Leadframes and Epoxy Resin", Journal of Adhesion, 2000, pp. 65-83, vol. 72.

Yamamoto, Yuichi et al., "Self-Assembled Layers of Alkanethiols on Copper for Protection Against Corrosion", Journal of the Electrochemical Society, 1993, pp. 436-443, vol. 140, No. 2, The Electrochemical Society, Inc.

Ramanath, G. et al., "Self-assembled subnanolayers as interfacial adhesion enhancers and diffusion barriers for integrated circuits", Applied Physics Letters, 2003, pp. 383-385, vol. 83, No. 2, American Institute of Physics.

* cited by examiner

*Primary Examiner* — Michael N Orlando
*Assistant Examiner* — Daniel Lee
(74) *Attorney, Agent, or Firm* — Nath, Goldberg & Meyer; Jerald L. Meyer; Stanley N. Protigal

(57) ABSTRACT

An adhesion bond between a metallic surface layer and a second surface is formed by treating the layers with a material comprising sulphur-containing molecules. The sulphur-containing molecules are applied as a surface treatment of the surfaces, so that the sulphur-containing molecules act as a coupling agent to bond chemically to both substrates form nanometer-sized structures on the surfaces. The nanometer-sized structures are incorporated into a self-assembly interlayer in between the surfaces, with the interlayer forming a bond to both surfaces.

11 Claims, 6 Drawing Sheets
(2 of 6 Drawing Sheet(s) Filed in Color)

IMPLEMENTING SELF-ASSEMBLY NANOMETER-SIZED STRUCTURES WITHIN METAL—POLYMER INTERFACE

RELATED APPLICATIONS

The present patent application claims priority to Provisional Patent Application No. 61/214,097 filed Apr. 21, 2009, which is assigned to the assignee hereof and filed by the inventors hereof and which is incorporated by reference herein.

BACKGROUND

1. Field

The present disclosure relates to a metal interface including microstructures in which metal substrates are modified in order to improve the integrity of the metal interface, such as a metal-polymer interface.

2. Background

The present disclosure is concerned with interfacial problems of metal-polymer interfaces. Due to the lack of intrinsic chemical bonding at the interfaces, the integrity of these interfaces is generally poor. Delamination and small molecule penetrations are common along these interfaces. The poor integrity induces failure, e.g., interfacial debonding, corrosion, electromigration, etc., especially under extreme and harsh conditions.

SUMMARY

An adhesion bond is formed between a metallic substrate having at least a metallic surface layer and a second substrate having a second surface. The substrate is subjected to a surface treatment by applying a self-assembly interlayer between the surface, the treatment comprising applying a material comprising a sulphur-containing molecules as a coupling agent to bond chemically to both substrates and form nanometer-sized structures on the substrates. The surfaces are brought into sufficiently close proximity to each other for the interlayer to bond to both surfaces.

BRIEF DESCRIPTION OF THE DRAWINGS

The file of this patent contains at least one drawing executed in color. Copies of this patent with color drawings will be provided by the Office upon request and payment of the necessary fee.

FIGS. 2A and 2B show a control surface and FIGS. 2C and 2D show the surface treated with thiol solution.

DETAILED DESCRIPTION

Overview

Figure 1:
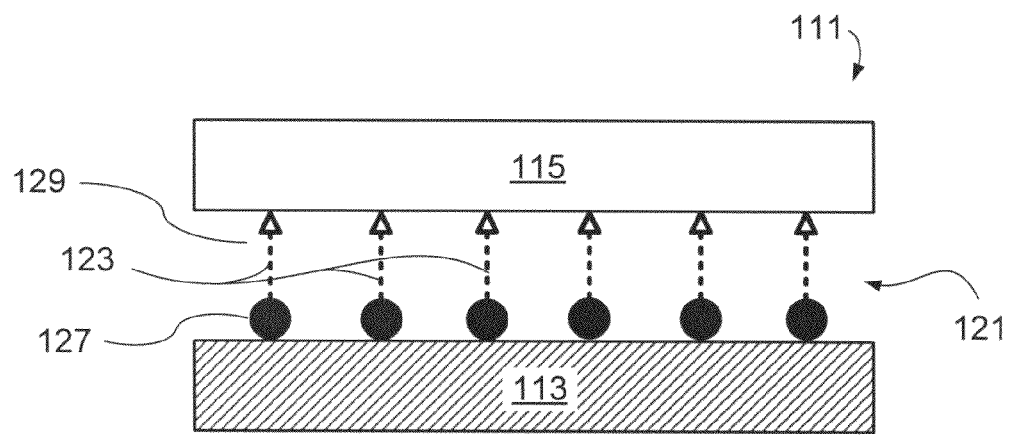
FIG. 1 is a schematic diagram depicting a cross-sectional view of a metal-polymer interface according to the current disclosure.

Nanometer-sized structures are formed between interfaces of metal with another material to improve the interfacial integrity. A surface treatment of sulphur-containing molecules with metal substrates results in the formation of the nanometer-sized structures on the metal substrates. The nanometer-sized structures are bonded chemically to both metals and non-metallic coatings. With the formation of this strong and high-density interlayer at the interface, microcrack formation and small molecule transportation is reduced. This can readily improve the integrity of a metal-polymer joint, in an interface of a metal substrate joined to a polymer coating, for example of a metal joined with another material. The resulting interface has increased reliability during operation. The disclosure discloses a surface treatment method and the materials used in modifying metal substrates. This solves the interfacial problems of a metal substrate joined to another material.

The interface comprises a metal substrate, a polymer coating and a nanometer-sized structure in between the two. The treatment process in this example comprises depositing at least one type of sulphur-containing molecules onto metal substrates.

In a particular configuration, the nanometer-sized structures are formed by use of sulphur-containing molecules which can be, but not limited to, thiol, sulfide, disulfide, polysulfide or combinations of these materials.

In a further example, a one-step room temperature surface treatment method is used to modify metal substrates with sulphur-containing molecules. The surface treatment method involves the introduction of nanometer-sized structures on metal substrates.

Another aspect of the disclosure is the nanometer-sized structures can provide direct chemical bonding to
1) metal substrates through a metal reactive group, and
2) polymer coating providing bonding through a polymer reactive group.

With formation of nanometer-sized features on the metal surface, strong joints are introduced at the interface.

The nanometer-sized structures are attached to both metal substrate and polymer coating with chemical bonds. With the formation of those nanometer-sized structures within the interface, strong interfacial adhesion has been achieved. The densely packed nanometer-sized structures at the interface can also hinder small molecules penetration along the interface. This reduces the chance of undesirable chemical reaction at the interface, which can significantly improve the integrity of metal-polymer interfaces. The techniques can be applied to any areas where the integrity of metal-polymer interfaces is concerned, including adhesion promotion, corrosion inhibition and diffusion hindrance. The surface treatments can improve the interfacial performance of a metal-polymer joint in terms of adhesion, corrosion, diffusion, and other properties related to the integrity of the metal-polymer interface.

Formation of a self-assembly interlayer within a metal-polymer interface is performed so as to improve the integrity of the interface. The interlayer is formed when sulphur-containing molecules are chemically attached to both metal substrates and polymer coatings. Nanometer-sized structures are used in the interlayer, and are used as an adhesion promoter, corrosion inhibitor and diffusion barrier to improve integrity of the interface.

Self-Assembly Interlayer

FIG. 1 illustrates a schematic diagram for an interface structure 111 and includes a metal substrate 113, a polymer coating 115 and a self-assembly interlayer 121 in between the metal substrate 113 and the polymer coating 115. The self-assembly interlayer 121 has nanometer-sized structures 123 according to the example. The nanometer-sized structures 123 are attached to both the metal substrate 113 and the polymer coating 115 and comprise sulphur-containing molecules which chemically bond to both the metal substrate 113 and the polymer coating 115.

The sulphur-containing molecules are introduced to the interface 111 to form the nanometer-sized structures 123. The sulphur-containing molecules are chosen to chemically bond with the metal substrate 113 and to promote an adhesion bond with the polymer coating 115 by modifying the surface of the metal substrate 113 with sulphur-containing molecules at the surface of the metal substrate 113.

The metal substrate 113 is selected from the group consisting of pure metal or an alloy containing copper, silver, gold, iron, aluminum, mercury, nickel, zinc, lead, tin or combinations of those. The metal substrate 113 can be manufactured from any suitable process including vapor deposition, electroplating, electroless plating, sputtering, evaporation, electrode position, roll annealing, etc. The metal substrate 113 may be of any thickness, and may have with any suitable surface roughness. The roughness may vary from one angstrom (Å) to 10,000 micrometers (µm), and varies with the particular application. The affinity of the sulphur-containing molecules is particularly effective with gold, silver and copper but also applies to other metals, for example, aluminum, aluminum alloys and the other metals described above.

The polymer coating 115 can be a thermoset, which can include, but is not limited to, epoxies, cyanoesters, polyimides, maleimide, bismaleimide triazine, silicones, and combinations thereof. Alternatively, the polymer coating 115 can be a thermoplastic, which can include, but is not limited to, polymethylmethacrylate, polyacrylonitrile, polyamide, polybutylene, polyurethane and combinations thereof. The polymer coating 115 can be applied on the metal substrates in any of the following types: sheet type, solvent type, emulsion type or aqueous solution type.

The surface treatment, in adsorbing the sulphur-containing molecules onto metal substrate 113, can be solution deposition, vapor deposition, thermal spraying, electrochemical deposition or other suitable processes under any possible conditions that forms nanometer-size structures 123 on metal substrates 113. When the self-assembly interlayer 121 is prepared from solution deposition, the sulphur-containing molecules can be dissolved in a solvent selected from alcohol, chloroform, tetrahydrofuran, acetone, actonitrile, water or other solvents that can dissolve the sulphur-containing molecules. The solution concentration for the surface treatment is prepared in range from 0.01 millimoles to 100 millimoles with pH between 3 to 14. The surface treatment involves immersion of the metal substrate 113 to the solution with an immersion time ranging from one second to one month under any agitation conditions according to reaction rate.

The self-assembly interlayer 121 is made of sulphur-containing molecules which comprises at least a metal reactive portion 127 and a polymer reactive portion 129. The metal reactive portion 127 is chemically bonded to metal substrates 113 through sulphur atoms. The metal reactive portion 127 is derived from sulphur-containing molecules which can be, but not limited to thiol, sulfide, disulfide, polysulfide or combinations of these materials. A criterion in selection of the sulphur-containing molecules is that they can form a nanometer-sized structure on the metal surface so as to ensure strong chemical bonds at the interface.

The polymer reactive portion 129 is chemically bonded to polymer coating 115. The polymer reactive portion 129 can be selected according to the target polymer adhesive. It should be reactive to the functional group of the polymer coating 115. The polymer reactive portion 129 can be derived from groups including halogen, epoxide, glycol, N, O, S, haloalkyl, hydroxy, aryloxy, benzloxy, alkoxy, haloalkoxy, amino, monoalkylamino, dialkylamino, heteroalkylamino, amide, alcohol, carboxylic acid, ester, ether, anhydride, acyloxy, acyl, ketone, quinone, aldehyde, carbohydrate, alkyl, aryl, and combinations thereof. The sulphur-containing molecules according to the current disclosure can contain alkyl, cycloalkyl, heterocyclic, alkadienyl, alkyne, aryl, heteroaryl, alkylaryl or arylalkyl or combinations thereof; and it may be singly or multiply substituted in singular or multiply bonded fashion.

The sulphur-containing molecules are generally applied as bi-functional molecules. The bi-functional characteristic may be achieved by including one sulphur or one thiol component (reactive to metal) and the other with organic reactive group (reactive to epoxy). The advantage of this technology is that the sulphur-containing molecules can be chemically bonded with both the metal substrates and the polymer. The densely formed bi-functional sulphur-containing molecules used in this configuration are advantageous in that the molecules enhance the chemical bonds along the interface. This avoids adding sulphur-containing molecules directly to epoxy formulation, which could hinder chemical bond formation and possibly reduce the adhesion.

Formation of the Nanometer-Sized Features

Figure 2A:
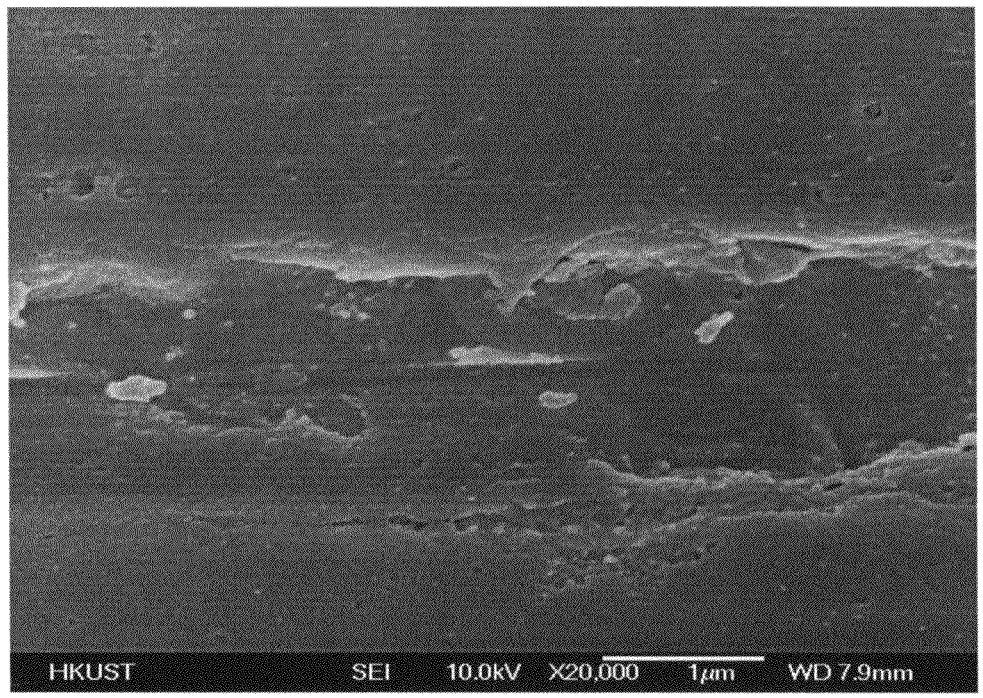
FIGS. 2A-2D are Scanning Electron Microscope (SEM) photomicrographs of a Cu surface.
Figure 2B:
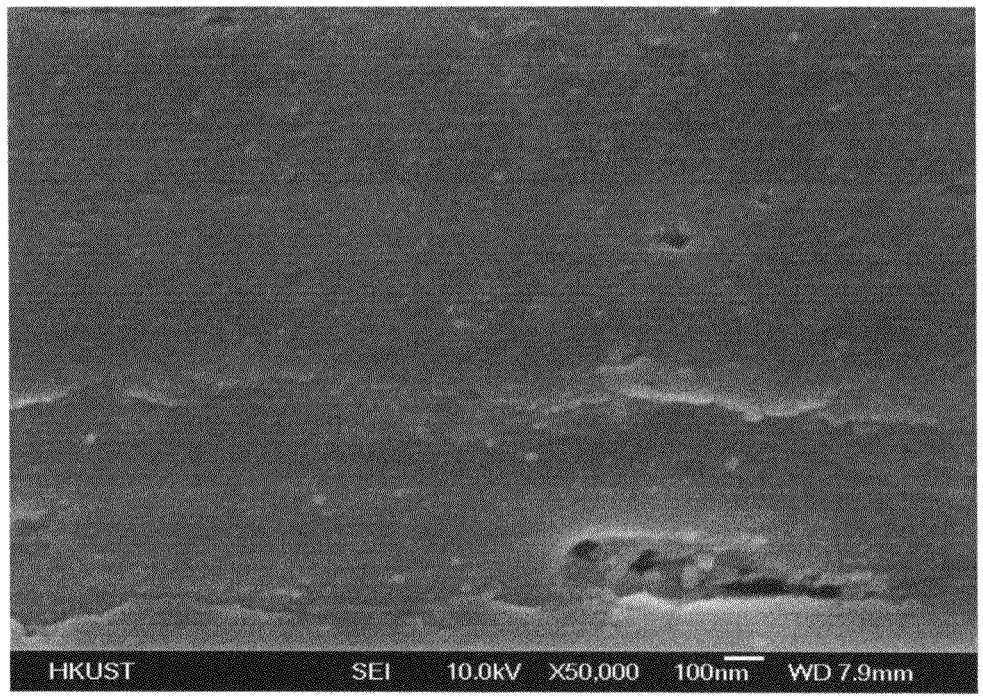
Figure 2C:
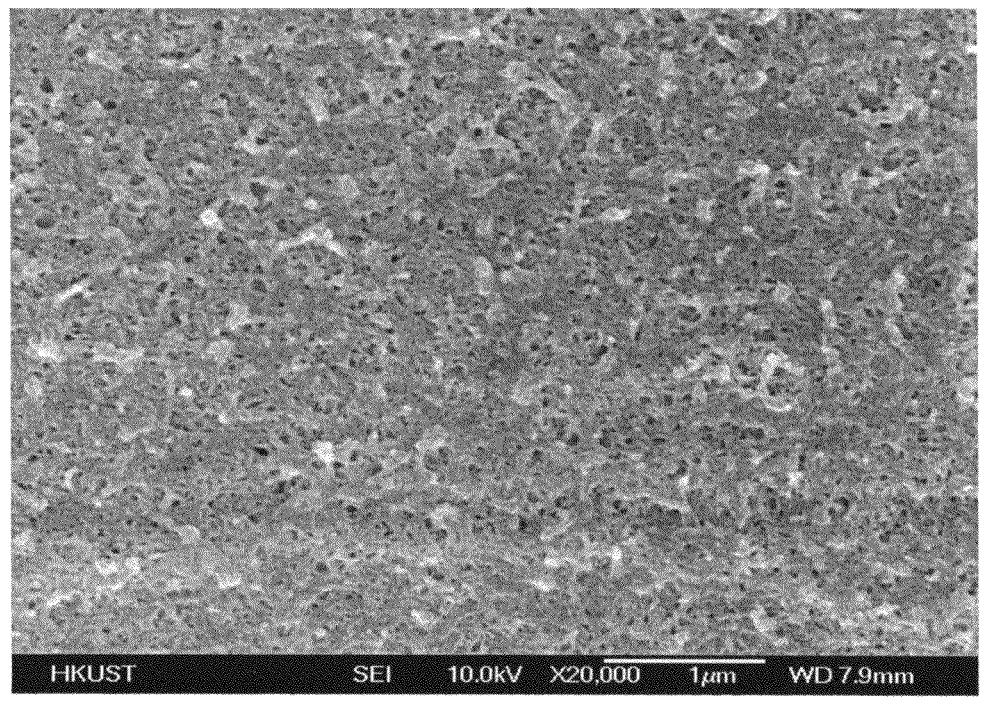
Figure 2D:
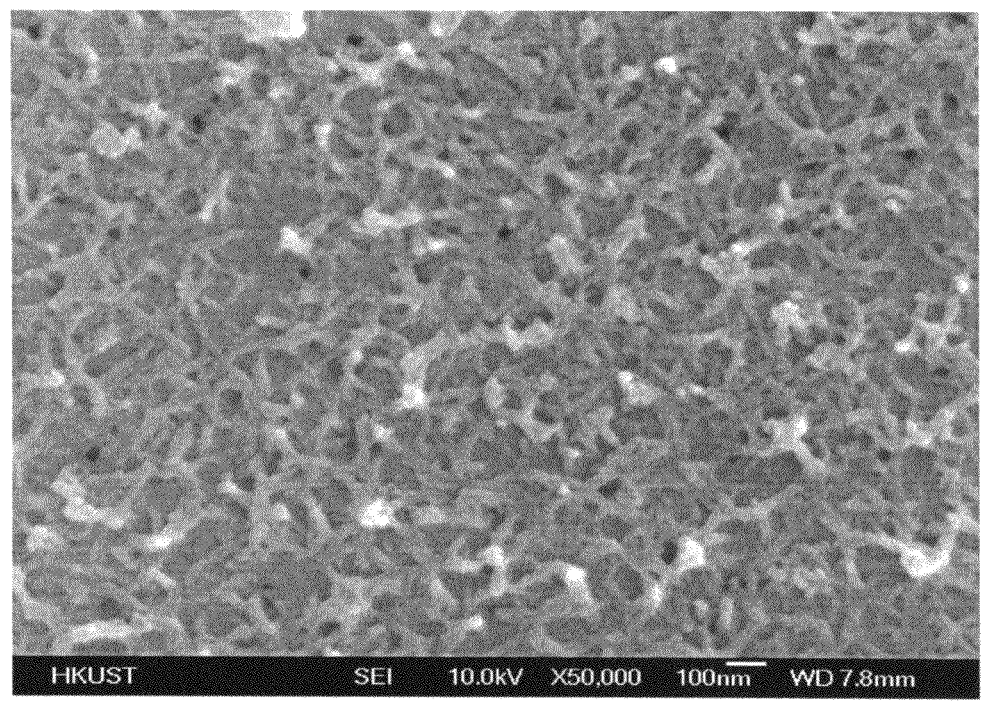

FIGS. 2A-2D are Scanning Electron Microscope (SEM) photomicrographs of a Cu surface. FIGS. 2A and 2B show a control surface and FIGS. 2C and 2D show the surface treated with thiol solution. FIGS. 2C and 2D are Scanning Electron Microscope (SEM) photomicrographs of a copper surface treated with thiol solution. FIG. 2C depicts the Cu surface at 20,000 magnification and FIG. 2D depicts the Cu surface at 50,000 magnification. These figures show surface morphology of copper substrates after solution deposition of sulphur-containing molecules, including formations of the nanometer-sized features typically range in size between approximately 100 nm and 10,000 nm. The size of the nanometer-sized features can be in the range of one angstrom to ten thousands angstroms. The thickness of self-assembly interlayer 121 can be in the range of 1 Å-100 k Å and the size of the nanometer-sized structures in the self-assembly interlayer 121 can be in the range of one 1 Å-10 k Å. These nanometer-sized features provide bonding sites to the polymer coating 115.

In comparing the control surface (FIGS. 2A and 2B) with the thiol treated surface (FIGS. 2C and 2D), nanometer-sized molecular network was observed on the thiol treated surface (FIGS. 2C and 2D). On the treated surface, the network structure of nanometer-size fibrils was observed from the thiol modified Cu surface and the nanometer-sized fibril network covered the entire substrate surface.

Figure 3A:
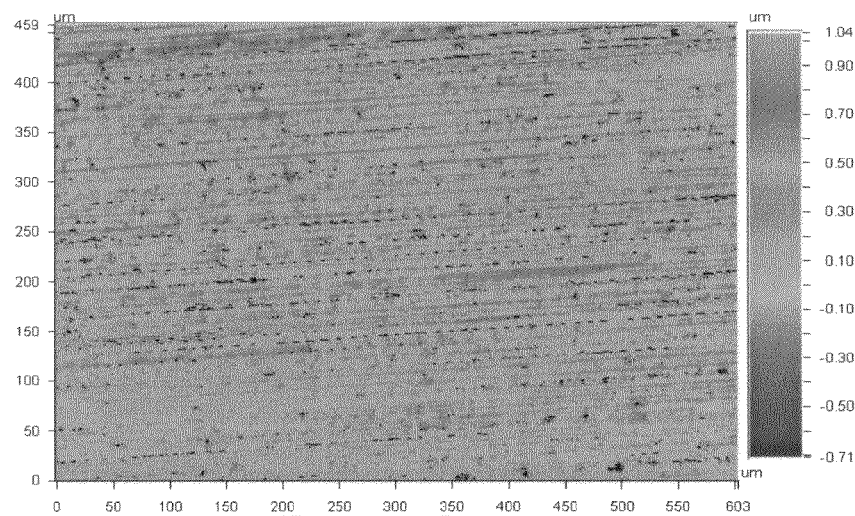
FIGS. 3A and 3B are spectrographs illustrating the effect root-mean-square roughness of a control copper substrate (FIG. 3A) and a copper substrate modified with the nanometer-sized features (FIG. 3B).
Figure 3B:
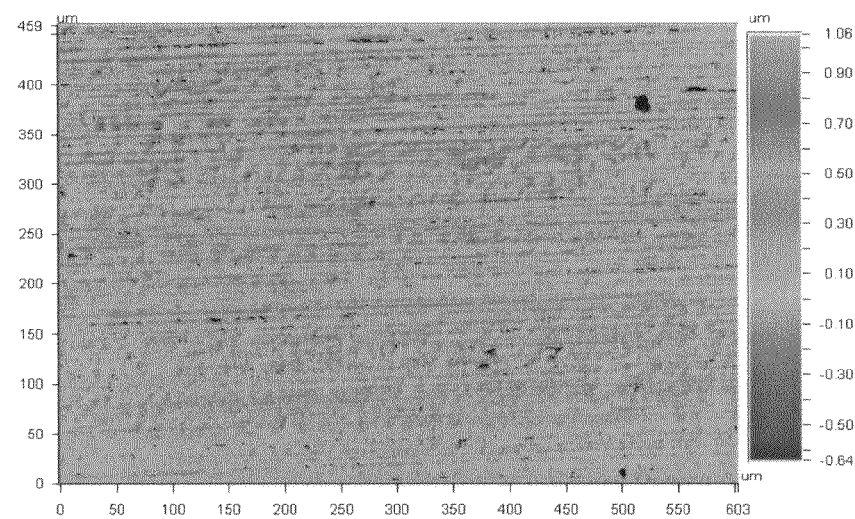

FIGS. 3A and 3B are spectrographs illustrating surface roughness, obtained by use of an optical three-dimensional profiler, of a control copper substrate (FIG. 3A) and a copper substrate modified with the nanometer-sized features (FIG.

3B). The average root-mean-square roughness for both the control and the substrate with the self-assembly interlayer was around hundreds of nanometers, with the data indicating no significant roughness change is induced with the surface treatment. In the example, the root-mean-square roughness of the control and the thiol-treated substrate is 126±31 and 119±13 nm, respectively.

Tapered Double Cantilever Beam Test

Figure 4:
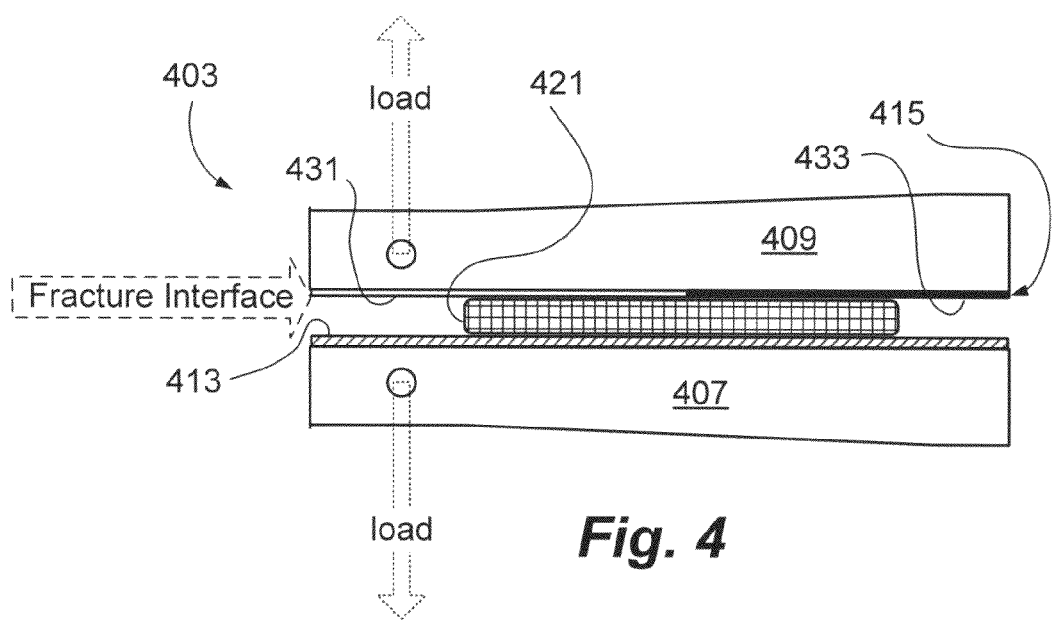
FIG. 4 is a diagram depicting a test sample configuration including a tapered double cantilever test jig used to perform load testing to determine critical load for stable crack propagation.

FIG. 4 is a diagram depicting a test sample configuration including a tapered double cantilever test jig 403. Jig 403 is used to perform load testing to determine critical load for stable crack propagation. The test jig 403 is made of copper and comprises bottom 407 and top 409 halves. The test jig 403 provides an interface structure which includes an epoxy adhesive 421, a testing interface layer 415 and the top metal substrate 409. To ensure failure take place along the interface structure, the testing interface layer 415 comprises a precrack region 431 and a self-assembly interlayer 433. Bottom half 407 forms a metal substrate and includes a non-testing layer 413 provided as an adhesion promoter layer to prevent foul debonding along the bottom substrate 407. Epoxy adhesive 421 is positioned between the non-testing layer 413 and the testing interface layer 415. A non-limiting example of an epoxy adhesive material is Henkel Loctite Hysol FP4526, which is an epoxy underfill (epoxy adhesive) material. The test sample was mounted on a MTS 858 Universal Testing Machine equipped with a 25 kN±5N axial force load cell. The applied load was controlled by setting the crosshead velocity to 30 μm/min in tension. The fracture load was recorded when the crack was stably propagating.

The load testing was performed for a control sample and for samples treated with sulphur-containing molecules. During testing of a control (untreated) sample, testing interface layer 415 is monolithic, except for separation from the epoxy adhesive 421. During testing of a treated sample, testing interface layer 415 comprises a precrack region 431 without sulphur-containing molecules treatment and a treated region, the self-assembly interlayer 433.

Figure 5:
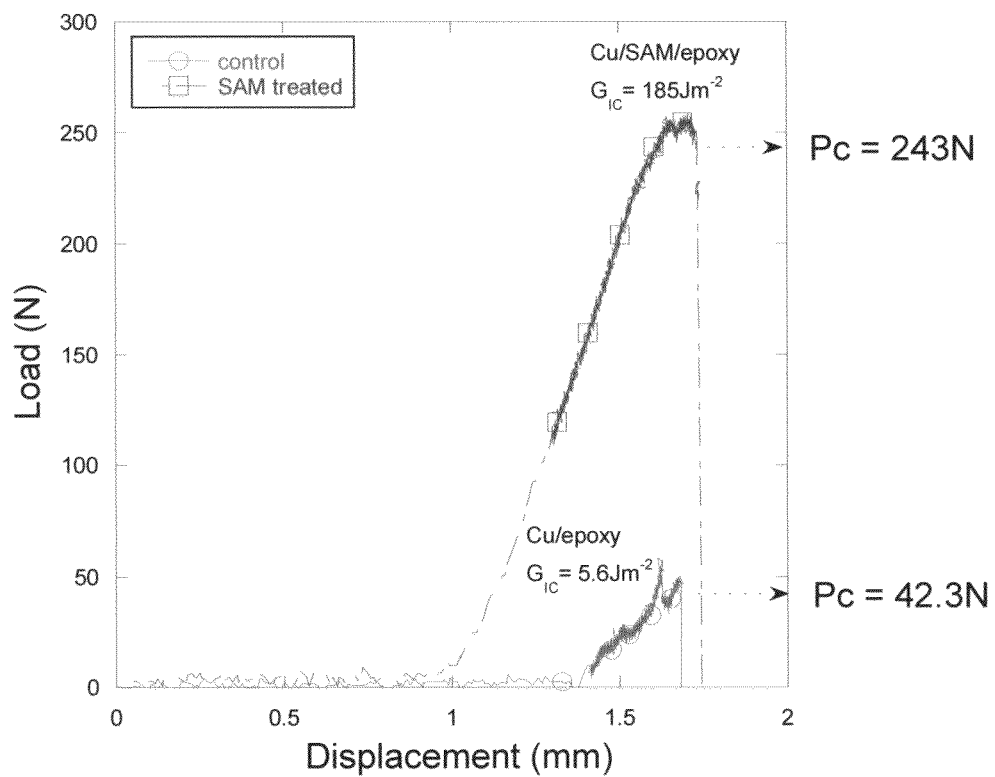
FIG. 5 is a graph depicting demonstrates the typical load-displacement curves obtained from tapered double cantilever tests for a sample having the nanometer-sized structures and a control (untreated) sample, using the test jig of FIG. 4.

FIG. 5 is a graph depicting demonstrates the typical load-displacement curves obtained from tapered double cantilever tests for a sample having the nanometer-sized structures and a control (untreated) sample, using the test configuration of FIG. 4. This graph demonstrates the typical load-displacement curves obtained from tapered double cantilever tests for a sample having the nanometer-sized structures and a control (untreated) sample. The test produced results in which the critical load for stable crack propagation for the control and the samples treated with sulphur-containing molecules as 39.2 N±3.3 N and 224.6 N±23.6 N respectively.

Figure 6:
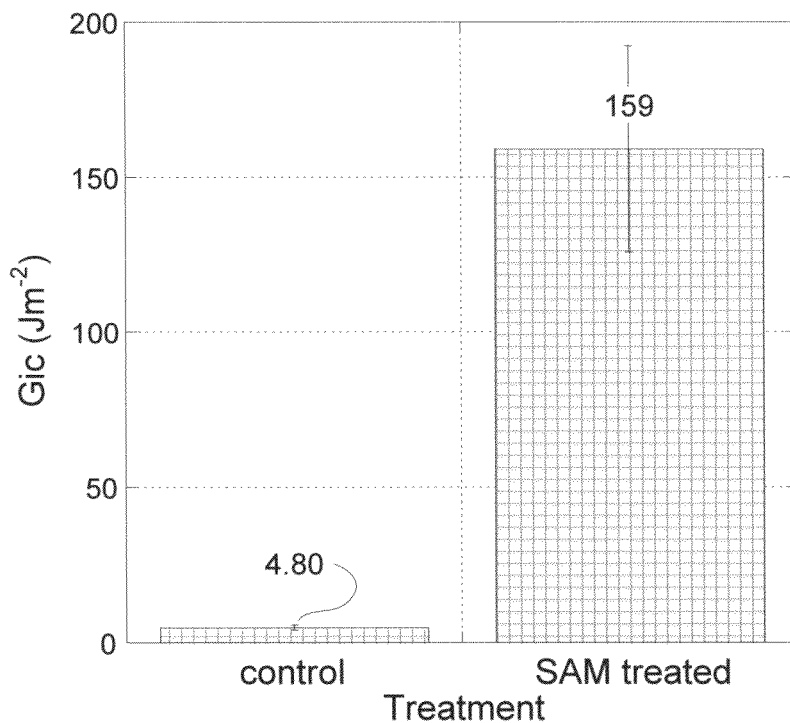
FIG. 6 is a graph showing an evaluation of interfacial adhesion improvement of a copper-epoxy interface under the surface treatment described in this disclosure.

FIG. 6 is a graph showing an evaluation of interfacial adhesion improvement of a copper-epoxy interface under the surface treatment described in this disclosure. The figure compares the interfacial adhesion energies ($Jm^{-2}$) of a treated sample under this disclosure with a control (untreated) sample. The interfacial adhesion energies increase from 4.8±0.8 $Jm^{-2}$ with the control sample to 159±33 $Jm^{-2}$ with the sample treated with sulphur-containing molecules.

Figure 7:
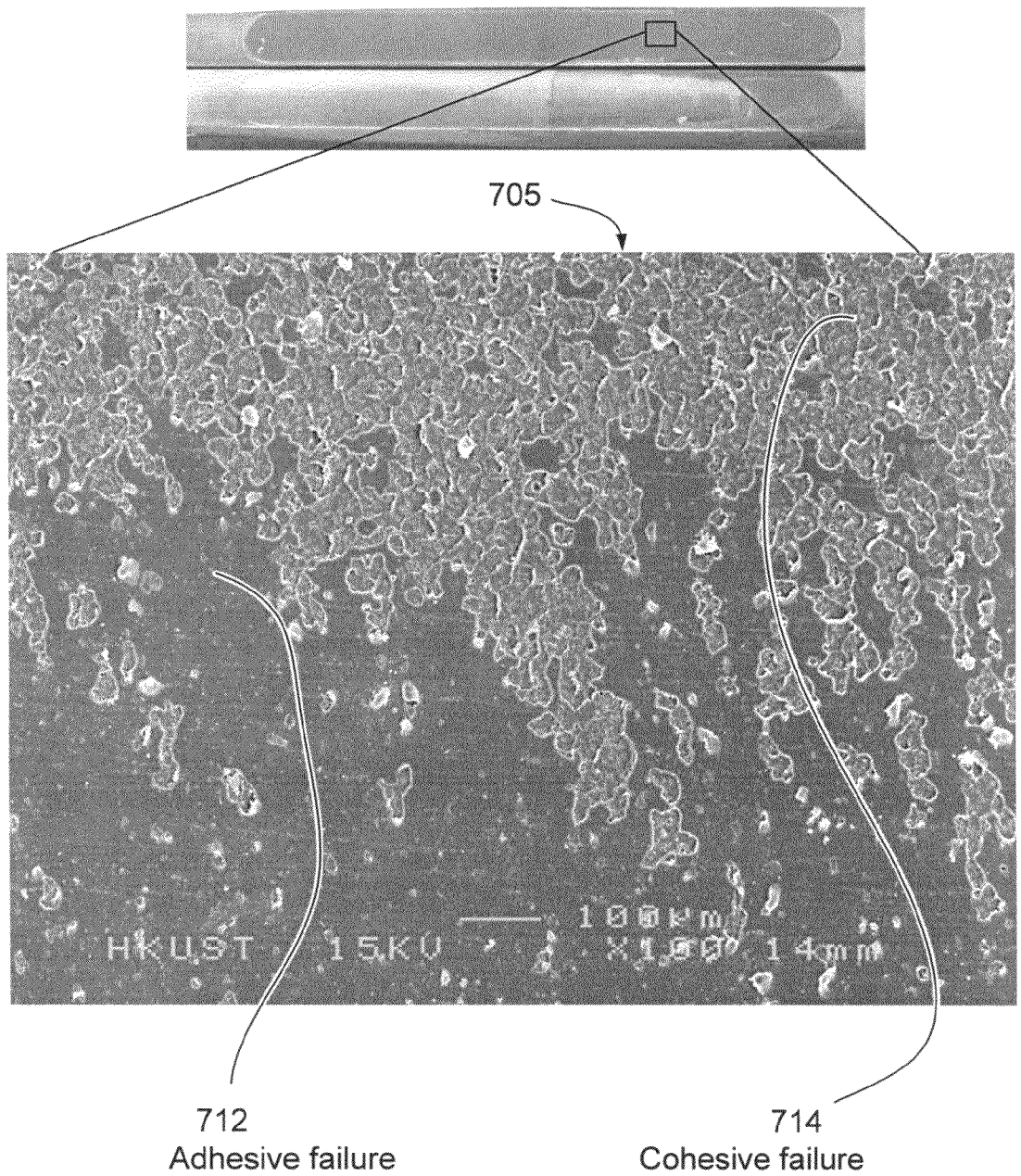
FIG. 7 is a morphological image of an epoxy surface after a fracture test of a sample treated according to the disclosed techniques.

FIG. 7 is a SEM morphological image of an epoxy surface 705 after a fracture test of a sample treated with the current disclosure. Depicted are an adhesive failure region 712 and a cohesive failure region 714. The upper view shows the fractured surface of epoxy with thiol treated samples after the tapered double cantilever test. The photos illustrate fractures occur in the sample with both adhesive and cohesive failure. The SEM indicates crack propagation with a large amount of energy dissipated.

Examples in implementing the nanometer-sized interlayer in between metal substrates and polymer coatings are given a follows:

Example 1

(1) Surface Treatment of Metal Substrate 5 g of 4-aminobenzenethiol is dissolved in ethanol and diluted to 5 mM solution for metal substrate treatment. Copper foil samples in the dimensions of 10 mm×70 mm×0.2 mm are used as substrates. Formation of the nanometer-sized structures on metal substrates is achieved by immersing the substrates into the 4-aminobenzenethiol solution at room temperature with stirring overnight. Excessive thiol molecules are eliminated from the substrates by rinsing with sufficient ethanol and blown dry in nitrogen.

(2) Application and Bonding of Polymer Coating 10 g of epoxy adhesive (Henkel Loctite Hysol FP4526) is dispensed onto the copper substrates after substrate treatment. The polymer underfill is bonded with the substrates by thermal curing at 80° C. for six hours.

Example 2

The nanometer sized-structures in between copper-epoxy are prepared in the same manner as in example 1, except that the surface modification agent is not 4-aminobenzenethiol but p-tolylmethanethiol. 10 g of p-tolylmethanethiol are dissolved in acetone. The thiols are adsorbed onto copper substrates at room temperature with stirring for two days. The bonding process of the polymer coating is the same as that in Example 1.

Example 3

The nanometer-size structures in between copper-epoxy are prepared in the same manner as in example 1, except that the surface modification agent is not 4-aminobenzenethiol (ATP) but 11-aminoundecane-1-thiol hydrochloride. 2 g of 11-aminoundecane-1-thiol hydrochloride are dissolved in water. The thiols are adsorbed onto copper substrates at room temperature with stirring for two hours. The bonding process of the polymer coating is the same as that in Example 1.

Example Materials

Other preferred sulphur-containing molecules as examples of materials adopted in this disclosure are given in the following list:

3-methylbenzenethiol,
3-aminobenzenethiol,
m-tolylmethanethiol,
4-amino-2-methylbenzenethiol,
4-methylbenzenethiol,
4-tert-butylbenzenethiol,
3-methyl-4-(p-tolyldisulfanyl)aniline,
4-(12-aminododecyl)-3-methylbenzenethiol,
4-((4-amino-2-methylphenyl)disulfanyl)benzoic acid,
4-amino poly(3-methylbenzl)thiol
4-tert-butylbenzenethiol

CONCLUSION

It will be understood that many additional changes in the details, materials, steps and arrangement of parts, which have been herein described and illustrated to explain the nature of the subject matter, may be made by those skilled in the art within the principle and scope of the invention as expressed in the appended claims.

What is claimed is:

1. A method for forming an adhesion promotion bond layer between a metallic substrate having at least a metallic surface layer and a second substrate having a second surface, the method comprising:
applying a surface treatment of the substrates as a self-assembly interlayer onto at least one of the surfaces, the treatment comprising using sulphur-containing molecules and forming a thiol modified surface as a coupling agent to bond chemically to both substrates and form a network structure of nanometer scale fibrils on the substrates and covering the entire treated substrate surface, wherein the thickness of self-assembly interlayer ranges between 1 Å-100 kÅ and the size of the nanometer scale fibrils in the self-assembly interlayer range from 1 Å-10 kÅ; and
bringing the surfaces into sufficiently close proximity to each other for the interlayer to contact both surfaces, with the fibrils penetrating, and bonding chemically to the second substrate.

2. The method as described in claim 1, comprising using a thiol compound as the sulphur-containing molecules.

3. The method as described in claim 2, wherein the interlayer comprises a combination of the thiol compound and a chemical structure capable of bonding to the second substrate material.

4. The method as described in claim 2, wherein the interlayer comprises a combination of the thiol compound and an organic material.

5. The method as described in claim 1, further comprising, using as the metallic substrate a material having a metallic surface layer selected from the group consisting of at least one of a pure metal or an alloy containing at least one of copper, silver, gold, iron, aluminum, mercury, nickel, zinc, lead and tin.

6. The method as described in claim 1, further comprising, using as the metallic substrate a material having a metallic surface layer formed by a process selected from the group consisting of vapor deposition, electroplating, electroless plating, sputtering, evaporation, electrode position and roll annealing.

7. The method as described in claim 1, further comprising using a polymer as the second substrate.

8. The method as described in claim 1, further comprising, using as the second substrate a thermoset polymer coating selected from the group consisting of epoxies, cyanoesters, polyimides, maleimide, bismaleimide triazine, and silicones.

9. The method as described in claim 1, further comprising, using as the second substrate a thermoplastic selected from the group consisting of polymethylmethacrylate, polyacrylonitrile, polyamide, polybutylene, polyurethane and combinations thereof.

10. The method as described in claim 1, further comprising,
applying a polymer as the second substrate, the polymer applied on the metal substrates by a technique selected from the group consisting of sheet application, solvent application, emulsion application and aqueous solution application.

11. A method for forming an adhesion promotion bond layer between a metallic substrate having at least a metallic surface layer and a second substrate having a second surface, the method comprising:
applying a surface treatment of the substrates as a self-assembly interlayer onto at least one of the surfaces, the treatment comprising applying a material comprising sulphur-containing molecules as a coupling agent to bond chemically to both substrates and forming a thiol modified surface as a network structure of nanometer scale fibrils on the substrates covering the entire treated substrate surface, wherein the thickness of self-assembly interlayer ranges between 1 Å-100 kÅ and the size of the nanometer scale fibrils in the self-assembly interlayer range from 1 Å-10 kÅ;
applying a polymer as the second substrate, the polymer applied on the metal substrates by a technique selected from the group consisting of sheet application, solvent application, emulsion application and aqueous solution application; and
bringing the surfaces into sufficiently close proximity to each other for the interlayer to contact both surfaces, with the fibrils penetrating, and bonding chemically to the second substrate.

* * * * *